United States Patent
Kim et al.

(10) Patent No.: US 9,466,657 B2
(45) Date of Patent: Oct. 11, 2016

(54) DISPLAY PANEL

(71) Applicant: Samsung Display Co., LTD., Yongin, Gyeonggi-Do (KR)

(72) Inventors: Dong-Gyu Kim, Yongin-si (KR); Joon-Hoo Choi, Seoul (KR); Sung-Jae Moon, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/678,716

(22) Filed: Apr. 3, 2015

(65) Prior Publication Data
US 2016/0141353 A1    May 19, 2016

(30) Foreign Application Priority Data

Nov. 18, 2014    (KR) ........................ 10-2014-0160457

(51) Int. Cl.
*H01L 27/32* (2006.01)

(52) U.S. Cl.
CPC ......... *H01L 27/3279* (2013.01); *H01L 27/326* (2013.01); *H01L 27/3267* (2013.01); *H01L 27/3276* (2013.01); *H01L 27/3286* (2013.01); *H01L 27/3288* (2013.01)

(58) Field of Classification Search
CPC . H01L 27/3279; H01L 27/326; H01L 27/32; H01L 27/3206; H01L 27/3209; H01L 27/3211; H01L 27/3237; H01L 27/3241; H01L 27/3244; H01L 27/3267; H01L 27/3281; H01L 27/3276; H01L 27/3266; H01L 27/3288
See application file for complete search history.

(56) References Cited

U.S. PATENT DOCUMENTS

| | | | |
|---|---|---|---|
| 7,403,184 B1* | 7/2008 | Moon | G09G 3/3688 345/87 |
| 2006/0109226 A1* | 5/2006 | Tyrrell | G09G 3/3611 345/98 |
| 2006/0158588 A1* | 7/2006 | Uh | G02F 1/1333 349/114 |
| 2012/0049215 A1* | 3/2012 | Yoon | H01L 27/326 257/91 |
| 2015/0102306 A1* | 4/2015 | Shi | H01L 27/3248 257/40 |

FOREIGN PATENT DOCUMENTS

| | | |
|---|---|---|
| KR | 10-2006-0079595 | 7/2006 |
| KR | 10-2008-0003193 | 1/2008 |
| KR | 10-2009-0057705 | 6/2009 |
| KR | 10-2012-0019016 | 3/2012 |

* cited by examiner

*Primary Examiner* — Galina Yushina
(74) *Attorney, Agent, or Firm* — Innovation Counsel LLP (57) ABSTRACT

A display panel is disclosed. The display panel includes a substrate, a plurality of first unit pixel and a plurality of second unit pixel. The substrate includes a first region and a second region extending in a first direction. The plurality of first unit pixels is disposed in the first region of the substrate. The first unit pixel has a first area. The plurality of second unit pixel is disposed in the second region of the substrate. The second unit pixel has a second area which is smaller than the first area.

11 Claims, 8 Drawing Sheets

DISPLAY PANEL

CROSS REFERENCE TO RELATED APPLICATION

This application claims priority under 35 USC §119 to Korean Patent Application No. 2014-0160457 filed on Nov. 18, 2014 in the Korean Intellectual Property Office (KIPO), the disclosures of which are herein incorporated by reference in their entireties.

BACKGROUND

1. Technical Field

Example embodiments relate to a display panel. More particularly, example embodiments relate to a transparent display panel including a plurality of pixels and a plurality of transparent windows.

2. Description of the Related Art

Recently, a transparent organic light emitting display device has been studied. The transparent organic light emitting display device can transmit an image of an object behind the organic light emitting display device when the organic light emitting display device operates in an "OFF" state. In an "ON" state of the organic light emitting display device, the organic light emitting display device may display an image in a pixel region adjacent to the transparent region using a light generated from an organic light emitting layer.

Generally, the transparent organic light emitting display device may include a plurality of unit pixels, and each of the unit pixel includes a pixel and a transparent window. In this case, the transparent organic light emitting display device may further include a plurality of wirings (for example, a scan wiring, a data wiring, a ELVDD wiring, a ELVSS wiring, a control wiring, etc.) The transparent window may not include wirings and circuits which are usually opaque to enhance a transparency.

There is a tradeoff between a resolution and a transmittance of the transparent organic light emitting display device. Therefore, it is hard to implement a high resolution and a high transmittance simultaneously.

SUMMARY

Example embodiments provide a display panel implementing a high resolution and a high transmittance simultaneously.

According to one aspect of example embodiments, there is provided a display panel including a substrate, a plurality of first unit pixel and a plurality of second unit pixel. The substrate includes a first region and a second region extending in a first direction. The plurality of first unit pixels is disposed in the first region of the substrate. The first unit pixel has a first area. The plurality of second unit pixel is disposed in the second region of the substrate. The second unit pixel has a second area which is smaller than the first area. A plurality of wiring groups includes a plurality of wirings. The plurality of wirings extends from the first region to the second region in a second direction substantially perpendicular to the first direction.

In example embodiments, the wirings may be divided into two portions at an interface between the first region and the second region.

In example embodiments, each of the wiring groups may include a first power supply wiring, a second power supply wiring, a control wiring and a data wiring.

In example embodiments, the display panel may further include a plurality of first scan wirings disposed in the first region, and a plurality of second scan wirings disposed in the second region. The plurality of first scan wirings and the plurality of second scan wirings may extend in the second direction.

In example embodiments, each of the first unit pixels includes a first pixel disposed in the first region, and a first transparent window disposed in the first region. The first transparent window may locate adjacent to the first pixel.

In example embodiments, each of the second unit pixels includes a second pixel disposed in the second region, and a second transparent window disposed in the second region. The second transparent window may locate adjacent to the second pixel.

In example embodiments, an area of the first pixel may be 4n times (where n is an integer) greater than an area of the second pixel.

In example embodiments, an area of the first transparent window is 4n times (where n is an integer) greater than an area of the second transparent window.

In example embodiments, the plurality of wiring groups may include a first wiring group and a second wiring group. The first wiring group corresponding to even-numbered (N) pixel column may be disposed adjacent to the second wiring group corresponding to odd-numbered (N+1) pixel column in the first region (where N is an integer).

In example embodiments, the first wiring group corresponding to even-numbered (N) pixel column and the second wiring group corresponding to odd-numbered (N+1) pixel column may have bilateral symmetry with an extension line of the center of the second transparent window as the line of symmetry.

In example embodiments, the first wiring group corresponding to even-numbered (N) pixel column and the second wiring group corresponding to odd-numbered (N+1) pixel column have a fan-out portion at an interface between the first region and the second region.

In example embodiments, the first wiring group corresponding to even-numbered (N) pixel column and the second wiring group corresponding to odd-numbered (N+1) pixel column may have a substantially identical length in the second direction.

According to one aspect of example embodiments, there is provided a display panel including a substrate, a plurality of first unit pixel and a plurality of second unit pixel. The substrate includes a first region and a second region extending in a second direction. The plurality of first unit pixels is disposed in the first region of the substrate. The first unit pixel has a first area. The plurality of second unit pixel is disposed in the second region of the substrate. The second unit pixel has a second area which is smaller than the first area. A plurality of wiring groups includes a plurality of wirings. The plurality of wirings extends from the first region to the second region in a first direction substantially perpendicular to the second direction.

In example embodiments, each of the wiring groups may include a plurality of scan wirings.

In example embodiments, the display panel may further include a plurality of first power supply wirings disposed in each of the first region and the second region, a plurality of second power supply wirings disposed in each of the first region and the second region, a plurality of control wirings disposed in each of the first region and the second region, and a plurality of data wirings disposed in each of the first region and the second region. The plurality of first power supply wirings, the plurality of second power supply wirings, the plurality of control wirings and the plurality of data wirings may extend in the second direction.

In example embodiments, each of the first unit pixels may include a first pixel disposed in the first region and a first transparent window disposed adjacent to the first pixel. Each of the second unit pixels may include a second pixel disposed in the second region and a second transparent window disposed adjacent to the second pixel.

In example embodiments, an area of the first pixel may be 2n times (where n is an integer) greater than an area of the second pixel. An area of the first transparent window may be 4n times (where n is an integer) greater than an area of the second transparent window.

In example embodiments, the plurality of scan wiring may include a first scan wiring and a second scan wiring. The first scan wiring may be connected to odd-numbered (2N+1) first unit pixels in the first region. The second scan wiring may be connected to even-numbered (2N) first unit pixels in the first region. Odd-numbered (2N+1) first unit pixels and even-numbered (2N) first unit pixels may be disposed adjacent to each other in the first direction (where N is an integer).

In example embodiments, an area of the first pixel may be 4n times (where n is an integer) greater than an area of the second pixel. An area of the first transparent window may be 4n times (where n is an integer) greater than an area of the second transparent window.

In example embodiments, the plurality of scan wiring may include a first scan wiring and a second scan wiring. The first scan wiring may be connected to odd-numbered (2N+1) first unit pixels in the first region, and the second scan wiring may be connected to even-numbered (2N) first unit pixels in the first region. Odd-numbered (2N+1) first unit pixels and even-numbered (2N) first unit pixels may be disposed adjacent to each other in the second direction (where N is an integer).

According to example embodiments, a display panel may have a first region (e.g., a low resolution region), a second region (e.g., a high resolution region) and a plurality of wirings extending from the first region to second region. In this case, a first unit pixel having a first area may be disposed in the first region, and a second unit pixel having a second area which may be smaller than the first area may be disposed in the second region. Therefore, the second region may display a high resolution image, and the first region may improve a transmittance of the display panel. Further, the plurality of wirings may have a fan-out portion, and the fan-out portion may have bilateral symmetry, and may have identical length. Therefore, an electrical resistance difference in the fan-out portion may be reduced or prevented, and the display panel may display a high quality image.

Figure 1:
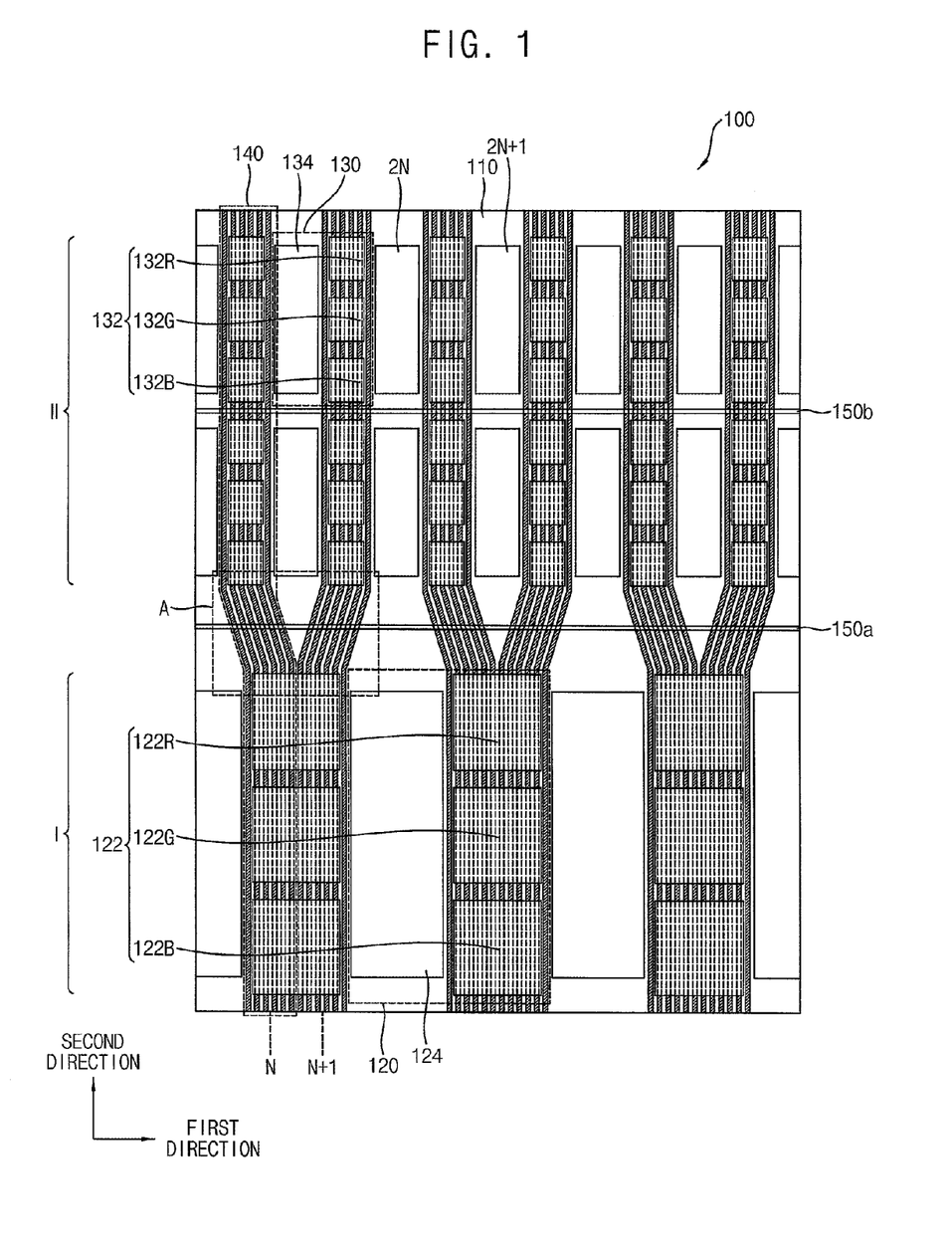
FIG. 1 is a plan view illustrating a display panel in accordance with some example embodiments.

According to comparative embodiments, if a resolution of a display panel increases and an area of the unit pixel decreases at a predetermined panel size, an area of the transparent window may decrease, and a transmittance of the display panel may also degrade. Further, as the resolution of the display panel increases, the number of wirings may also increase, so that a charging time for each wiring may decrease, and a quality of an image of the display panel may degrade. On the other hand, if an area of the transparent window increases in order to improve the transmittance of the display panel, an area of the unit pixel may also increase, and it is hard to implement a high resolution image. In order to solve the above problems, the display panel 100 according to example embodiments may include the first region (I) (that is, a low resolution region) and the second region (II) (that is, a high resolution region). Therefore, a transmittance of the display panel 100 may be improved due to the first transparent window 124 in the first region (I), and the second region (II) may display the high resolution image. That is, the display panel 100 may have an improved transmittance and may display the high resolution image simultaneously. Further, the display panel 100 may use either the first region (I) or the second region (II) selectively, so that a power consumption of the display panel 100 may decrease.

Figure 2:
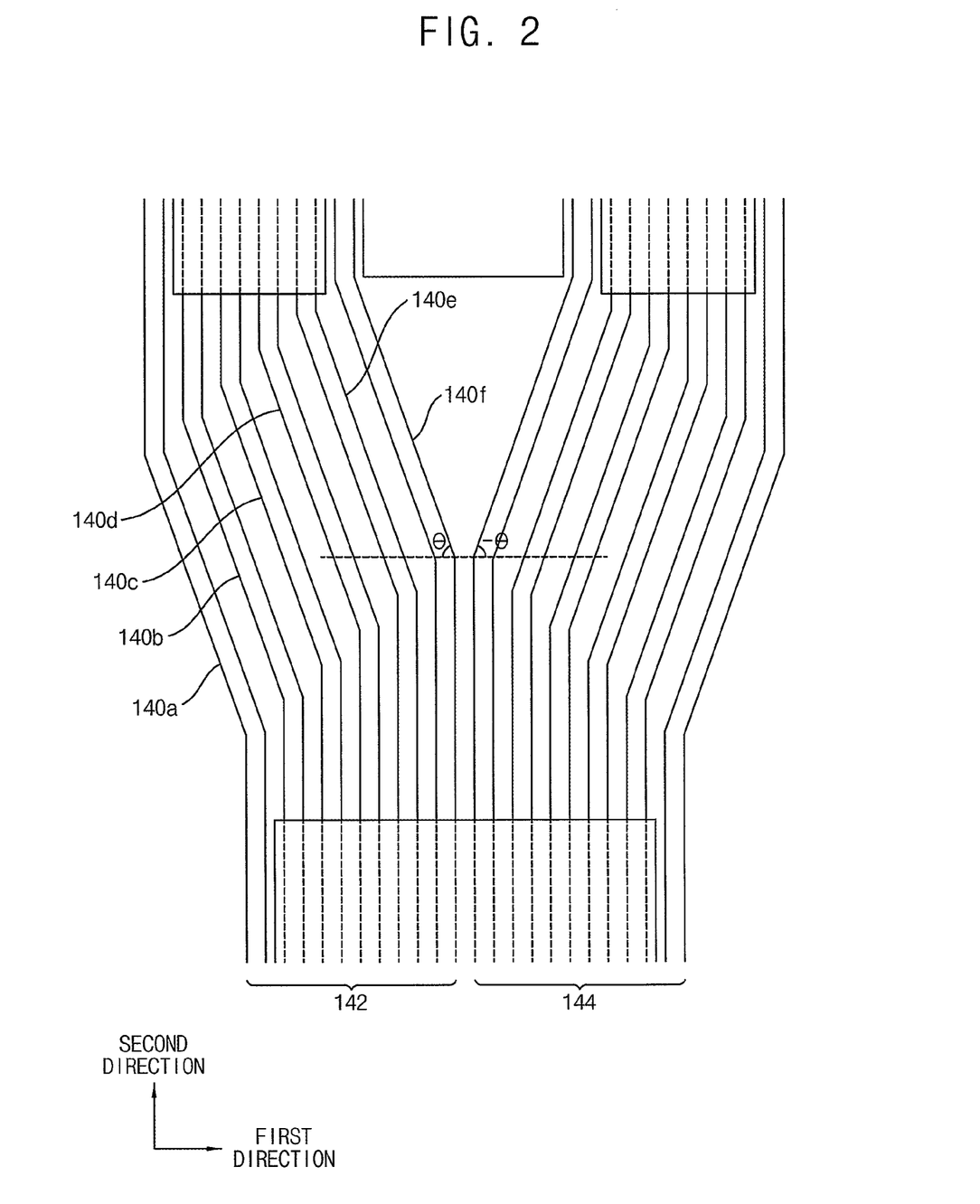
FIG. 2 is an enlarged plan view of region A of FIG. 1.

Further, the display panel 100 may include the wiring groups 140 which may have the plurality of wirings 140a, 140b, 140c, 140d, 140e and 140f extending from the first region (I) to the second region (II). The plurality of wirings 140a, 140b, 140c, 140d, 140e and 140f may have a fan-out portion at the interface between the first region (I) and the second region (II), and the fan-out portion may have bilateral symmetry and may have identical length. Therefore, an electrical resistance difference between the plurality of wirings may be reduced or prevented, and the display panel may display a high quality image.

BRIEF DESCRIPTION OF THE DRAWINGS

Example embodiments can be understood in more detail from the following description taken in conjunction with the accompanying drawings, in which.

DESCRIPTION OF EMBODIMENTS

The example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present between the element or layer and the another element or layer. In contrast, when an element is referred to as being "directly on," "directly connected to" or "directly coupled to" another element or layer, there are no intervening elements or layers present between the element or layer and the another element or layer. Like or similar reference numerals refer to like or similar elements throughout the specification. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another element, component, region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
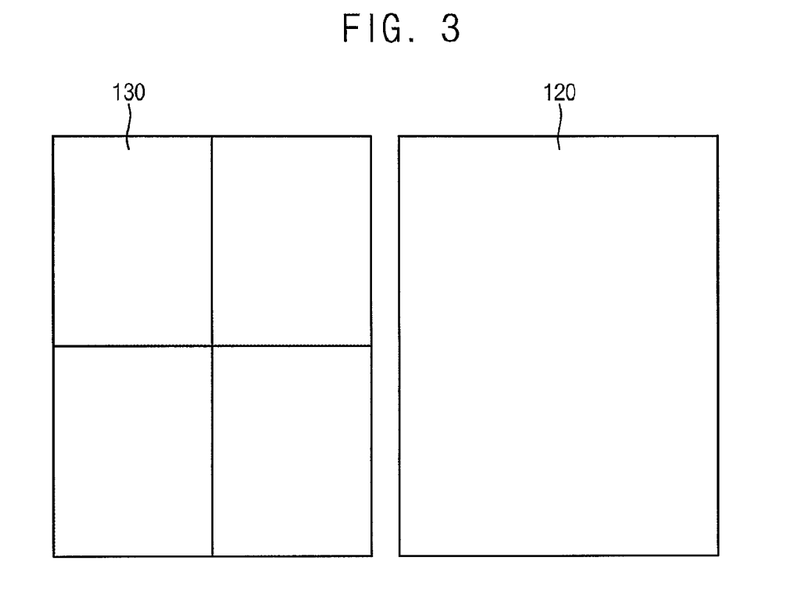
FIG. 3 is a plan view illustrating unit pixels of a second region and a first region of a display panel in accordance with some example embodiments.

FIG. 1 is a plan view illustrating a display panel in accordance with some example embodiments. FIG. 2 is an enlarged plan view of region A of FIG. 1. FIG. 3 is a plan view illustrating unit pixels of a second region and a first region of a display panel in accordance with some example embodiments.

Referring to FIGS. 1 to 3, the display panel 100 may include a substrate 110, a plurality of first unit pixels 120, a plurality of second unit pixels 130, a plurality of wiring groups 140, etc.

The substrate 110 may include a first region (I) and a second region (II). For example, the first region (I) may be a low resolution region, and the second region (II) may be a high resolution region. In this case, each of the first region (I) and the second region (II) may extend in a first direction. Therefore, an interface between the first region (I) and the second region (II) may extend in the first direction.

For example, the substrate 110 may include a transparent material such as glass or polyimide-based resin. Therefore, the substrate 110 may not degrade a transmittance of the display panel 100, and may have a relatively high mechanical strength.

The plurality of first unit pixels 120 may be disposed in the first region (I) of the substrate 110. Each of the first unit pixels 120 may include a first pixel 122 and a first transparent window 124. Further, each of the first unit pixels 120 may have a first area.

The first pixel 122 may include a first red sub pixel 122R, a first green sub pixel 122G, and a first blue sub pixel 122B. The first transparent window 124 may be disposed adjacent to the first pixel 122. The number of the first unit pixels 120 may be adjusted depending on a resolution and an area of the first region (I). In example embodiments, an area of each of the first red sub pixel 122R, the first green sub pixel 122G and the first blue sub pixel 122B may be identical as illustrated in FIG. 1. However, the present invention may not be limited thereto. For example, an area of the first blue sub pixel 122B may be different from an area of the first red sub pixel 122R or the first green sub pixel 122G.

When the second region (II) is in an off-state, the first region (I) may display less important information. Alternatively, the second region (II) may display an image in conjunction with the first region (I), as necessary. Further, the transistors, the capacitors and the organic light emitting structure and the wirings may be disposed not to overlap the first transparent window 124, so that a transmission image passing through the first transparent window 124 may not be blocked. That is, as an area of the first transparent window 124 increases, a transmittance of the display panel 100 may increase, and a deformation of the transmission image may decrease.

The plurality of second unit pixels 130 may be disposed in the second region (II). Each of the second unit pixels 130 may include a second pixel 132 and a second transparent window 134. Further, each of the second unit pixels 130 may have a second area which may be different from the first area of the first unit pixel 120.

In example embodiments, a location of the second transparent window 134 may be decided with consideration for a location of the first transparent window 124. For example, odd-numbered (2N+1) second transparent window 134 may extend in the second direction and an extension line of the odd-numbered (2N+1) second transparent window 134 may not overlap the first transparent window 124 in the first region I. While, even-numbered (2N) second transparent window 134 may extend in the second direction and an extension line of the even-numbered (2N) second transparent window 134 may overlap the first transparent window 124 in the first region I. A center of even-numbered (2N) second transparent window 134 may coincide with a center of the first transparent window 124, when viewed from the second direction. While, an extension line of a center of odd-numbered (2N+1) second transparent window 134 may be disposed between adjacent first transparent windows in the center of the first pixel 122.

The second pixel 132 may include a second red sub pixel 132R, a second green sub pixel 132G, and a second blue sub pixel 132B. In example embodiments, an area of each of the second red sub pixel 132R, the second green sub pixel 132G and the second blue sub pixel 132B may be identical as illustrated in FIG. 1. However, the present invention may not be limited thereto. For example, an area of the second blue sub pixel 132B may be different from an area of the second red sub pixel 132R or the second green sub pixel 132G. The second transparent window 134 may be disposed adjacent to the second pixel 132. The number of the second unit pixels 130 may be adjusted depending on a resolution and an area of the second region (II). In example embodiments, the second region (II) may display a high resolution image, so that the number of the second unit pixels 130 in a predetermined area may be greater than those of the first unit pixels 120. Therefore, the second region (II) including the second unit pixels 130 may display relatively more important information such as an important text and a detailed image.

Each of the sub pixels (that is, the first red sub pixel 122R, the first green sub pixel 122G, and the first blue sub pixel 122B) of the first unit pixels 120 may be arranged along the first direction, and each of the sub pixels (that is, the second red sub pixel 132R, the second green sub pixel 132G, and the second blue sub pixel 132B) of the second unit pixels 130 may be arranged along the first direction. That is, the same colored sub pixels are arranged along the first direction. Therefore, the sub pixels may be formed by a small mask scanning (SMS) process in which a pattern may be deposited on the substrate 110, while the substrate 110 is moved during pixel deposition while both the small mask scanning (SMS) and evaporation sources are kept stationary. Therefore, a process time for forming the sub pixels may decrease, and a process cost may also decrease. Further, the small mask scanning process may use the mask which may be smaller than that of a fine metal mask deposition process, so that a damage of the mask (e.g., a bending of the mask) may be prevented or reduced.

The plurality of wiring groups 140 may include the plurality of wirings 140a, 140b, 140c, 140d, 140e and 140f. In example embodiment, the plurality of wiring groups 140 may be arranged in the first direction, and each of the wiring groups 140 may extend along the second direction. That is, the plurality of wirings 140a, 140b, 140c, 140d, 140e and 140f may extend from the first region (I) to the second region (II) in the second direction. In example embodiment, the wirings 140a, 140b, 140c, 140d, 140e and 140f may have a fan-out portion at the interface between the first region (I) and the second region (II Two wiring groups 140 in the second region II are merged into one big wiring group in the first region I. Accordingly, the wiring groups 140 in the first region (I) and the second region (II) may be connected continuously, so that the first unit pixels 120 in the first region (I) and the second unit pixels 130 in the second region (II) may be charged by an external signal (that is, a gradation signal) simultaneously.

As illustrated in FIG. 1 and FIG. 2, each of adjacent wiring groups 140 may include the wirings 140a, 140b, 140c, 140d, 140e and 140f which have a fan-out portion. The fan-out portion of the adjacent wiring groups 140 may have a line of symmetry and an extension line of the line of symmetry passes through a center of the odd numbered (2N+1) second transparent window 134, so that the wirings 140a, 140b, 140c, 140d, 140e and 140f may extend along the second direction while maintaining a same space, width and length. For example, the wirings 140a, 140b, 140c, 140d, 140e and 140f may include a first power supply wiring (ELVDD), a second power supply wiring (ELVSS), a controlling wiring and a data wiring. Further, a plurality of first scan wirings 150a in the first region (I) and a plurality of second scan wirings 150b in the second region 150b may be arranged in the second direction, and each of which may extend in the first direction. In this case, a distance between the adjacent first scan wirings 150a in the second direction may be greater than a distance between the adjacent second scan wirings 150b in the second direction.

In example embodiments, each of the wiring groups 140 may include the first power supply wiring 140a, the controlling wiring 140b, the second power supply wiring 140c, and the data wirings 140d, 140e and 140f which may be sequentially arranged in the first direction, as illustrated in FIGS. 1 and 2, however the present invention may not be limited thereto. For example, the first power supply wiring 140a, the controlling wiring 140b, the second power supply wiring 140c, and the data wirings 140d, 140e and 140f may be arranged randomly.

Referring to FIGS. 1 and 2, even-numbered (N) wiring group 142 and odd-numbered (N+1) wiring group 144 may be disposed adjacent to each other in the first region (I) to form one big wiring group. In example embodiments, even-numbered (N) wiring group 142 and odd-numbered (N+1) wiring group 144 may have a fan-out portion at the interface between the first region (I) and the second region (II). For example, even-numbered (N) wiring group 142 may be inclined with an angle θ with respect to the first direction, and odd-numbered (N+1) wiring group 144 may be inclined with an angle −θ with respect to the first direction. Accordingly, even-numbered (N) wiring group 142 and odd-numbered (N+1) wiring group 144 may have bilateral symmetry with an extension line of the center of the second transparent window 134 as the line of symmetry. Further, even-numbered (N) wiring group 142 and odd-numbered (N+1) wiring group 144 may have an identical length. Therefore, an electrical resistance difference (or resistance-capacitance (RC) impedance difference) between even-numbered (N) wiring group 142 and odd-numbered (N+1) wiring group 144 may be reduced or prevented. Accordingly, a stain like vertical line defect may be prevented, and the display panel may display a high quality image.

Referring to FIGS. 1 and 3, an area of the first unit pixel 120 may be substantially 4n times greater than an area of the second unit pixel 130 (where n is an integer). Therefore, an area of the first transparent window 124 may be substantially 4n times greater than an area of the second transparent window 134, so that an aperture ratio of the display panel 100 may be greater than about 70%, so that the display panel 100 may have a predetermined transmittance.

In other example embodiments, an area of the first unit pixel 120 may not be substantially 4n times greater than an area of the second unit pixel 130. For example, the areas of the first unit pixel 120 and the second unit pixel 130 may be adjusted as necessary.

According to comparative embodiments, if a resolution of a display panel increases and an area of the unit pixel decreases at a predetermined panel size, an area of the transparent window may decrease, and a transmittance of the display panel may also degrade. Further, as the resolution of the display panel increases, the number of wirings may also increase, so that a charging time for each pixel may decrease, and a quality of an image of the display panel may degrade. On the other hand, if an area of the transparent window increases in order to improve the transmittance of the display panel, an area of the unit pixel may also increase, and it is hard to implement a high resolution image. In order to solve the above problems, the display panel 100 according to example embodiments may include the first region (I) (that is, a low resolution region) and the second region (II) (that is, a high resolution region). Therefore, a transmittance of the display panel 100 may be improved due to the first transparent window 124 in the first region (I), and the second region (II) may display the high resolution image. That is, the display panel 100 may have an improved transmittance and may display the high resolution image simultaneously. Further, the display panel 100 may use either the first region (I) or the second region (II) selectively, so that a power consumption of the display panel 100 may decrease.

Further, the display panel 100 may include the wiring groups 140 which may have the plurality of wirings 140*a*, 140*b*, 140*c*, 140*d*, 140*e* and 140*f* extending from the first region (I) to the second region (II). The plurality of wirings 140*a*, 140*b*, 140*c*, 140*d*, 140*e* and 140*f* may have a fan-out portion at the interface between the first region (I) and the second region (II), and the fan-out portion may have bilateral symmetry and may have identical length. Therefore, an electrical resistance difference between the plurality of wirings 140*a*, 140*b*, 140*c*, 140*d*, 140*e* and 140*f* may be reduced or prevented, and display panel may display a high quality image.

Figure 4:
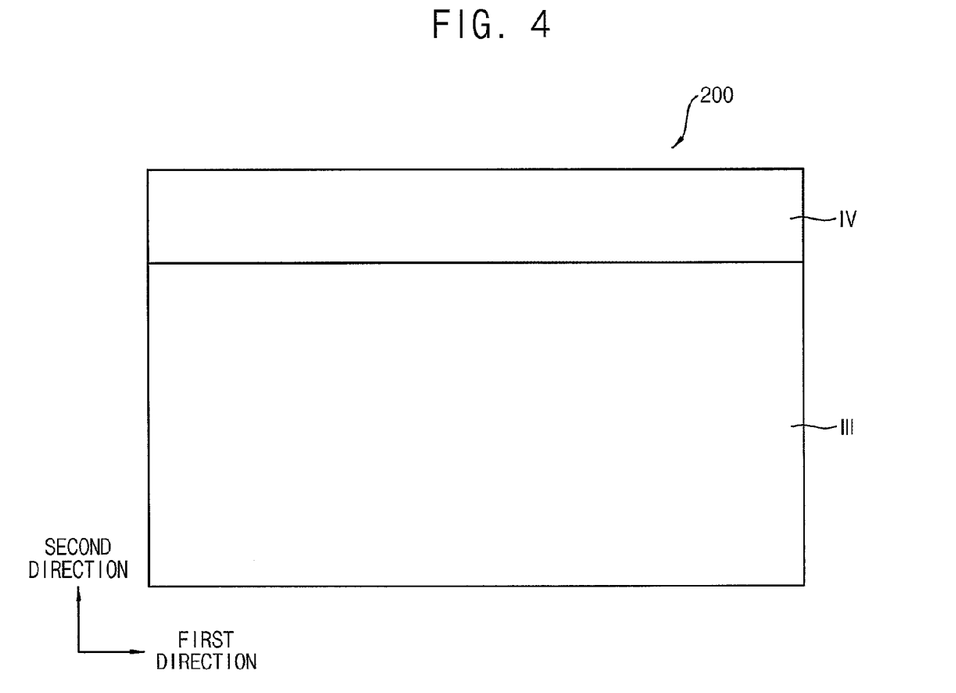
FIG. 4 is a plan view illustrating an arrangement of a second region and a first region of a display panel in accordance with some example embodiments.
Figure 5:
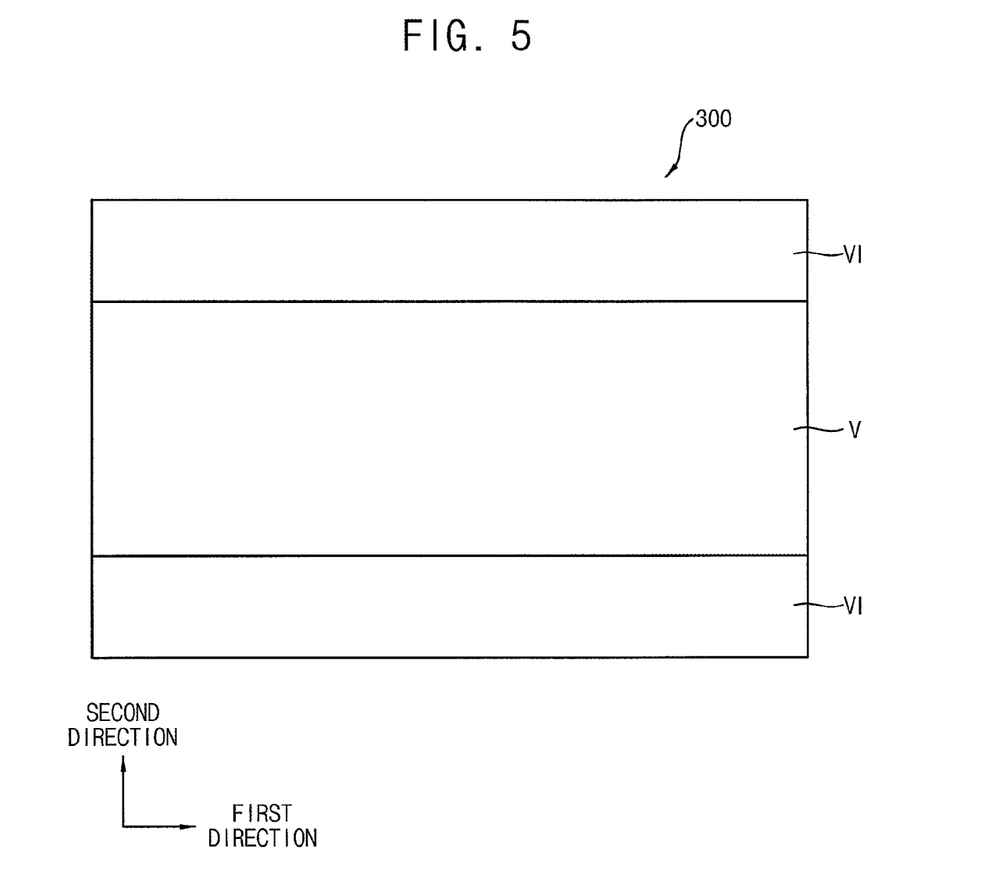
FIG. 5 is a plan view illustrating an arrangement of a second region and a first region of a display panel in accordance with other example embodiments.

FIG. 4 is a plan view illustrating an arrangement of a second region and a first region of a display panel in accordance with some example embodiments, and FIG. 5 is a plan view illustrating an arrangement of a second region and a first region of a display panel in accordance with other example embodiments.

Referring to FIG. 4, the display panel 200 may include a first region (III) and a second region (IV). For example, the first region (III) may be a low resolution region, and the second region (IV) may be a high resolution region, or vice versa. In this case, each of the first region (III) and the second region (IV) may extend in a first direction. In this case, the first region (III) may have a transmittance which may be higher than that of the second region (IV), and the second region (IV) may have a resolution which may be higher than that of the first region (III). For example, while the second region (IV) may display a relatively large quantity of information such as an important text and a detailed image, the first region (III) may be in an off-state in order to save power consumption, or the first region (III) may display a relatively small quantity of information. Therefore, the display panel 200 may have an improved efficiency. However, the present invention may not be limited thereto.

As illustrated in FIG. 5, the display panel 300 may include a first region (V) and second regions (VI). The first region (V) may be disposed at a center portion of the display panel 300, and the second regions (VI) may be disposed at a bottom portion and a top portion of the display panel 300. For example, the first region (V) may be a low resolution region, and the second region (VI) may be a high resolution region.

Figure 6:
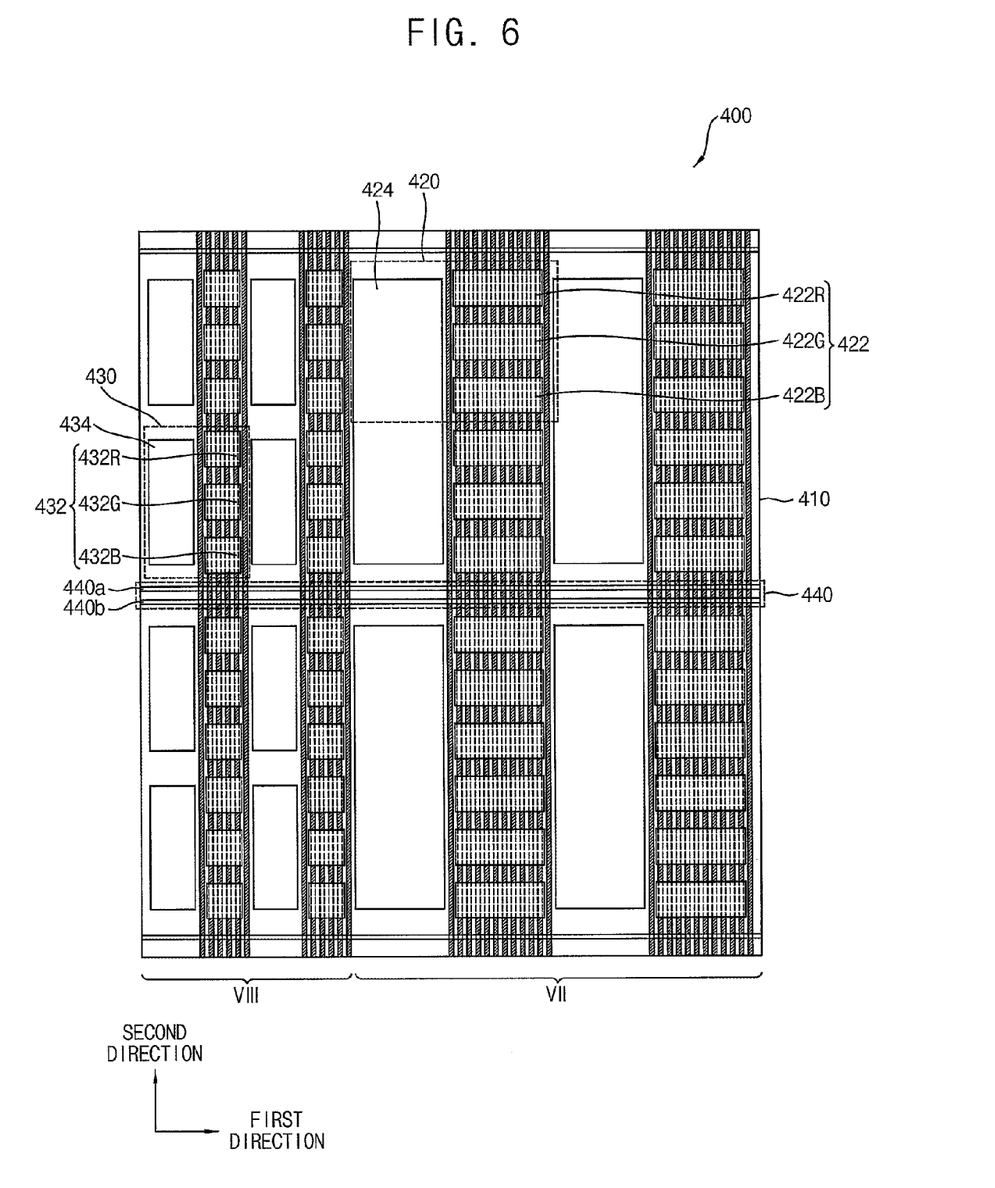
FIG. 6 is a plan view illustrating a display panel in accordance with other example embodiments.

FIG. 6 is a plan view illustrating a display panel in accordance with other example embodiments.

Referring to FIG. 6, the display panel 400 may include a substrate 410, a plurality of first unit pixels 420, a plurality of second unit pixels 430, a plurality of wiring groups 440, etc.

The substrate 410 may include a first region (VII) and a second region (VIII). For example, the first region (VII) may be a low resolution region, and the second region (VIII) may be a high resolution region.

The plurality of first unit pixels 420 may be disposed in the first region (VII) of the substrate 410. Each of the first unit pixels 420 may include a first pixel 422 and a half of first transparent window 424.

The first pixel 422 may include a first red sub pixel 422R, a first green sub pixel 422G, and a first blue sub pixel 422B. However, the number of the sub pixels may not be limited thereto. For example, the first unit pixel may include sub pixels which may be greater than three. In example embodiment, the first transparent window 424 may be formed in a region corresponding to two first unit pixels 420. For example, single first transparent window 424 may correspond to two first unit pixels 420 which may be disposed adjacent to each other in the second direction.

The plurality of second unit pixels 430 may be disposed in the second region (VIII) of the substrate 410. Each of the second unit pixels 420 may include a second pixel 432 and a second transparent window 434. The second transparent window 434 may be disposed adjacent to the second pixel 432. As illustrate in FIG. 6, an area of the first unit pixel 420 may be substantially 2n times greater than an area of the second unit pixel 430 (where n is an integer), and an area of the first transparent window 424 may be substantially 4n times greater than an area of the second transparent window 434.

The display panel 400 in accordance with example embodiments may include the wiring groups 440 having a first scan wiring 440*a* and a second scan wiring 440*b* which may extend from the first region (VII) into the second region (VIII), and may be connected to one unit pixel rows in the second region (VIII) and one unit pixel row in the first region (VII). Therefore, a required time for charging the first and second unit pixels 420 and 430 in order to express single frame may be identical to a time for charging the second unit pixels 420 in the second region (VIII).

As mentioned above, single first transparent window 424 may correspond to two first unit pixels 420 which may be disposed adjacent to each other in the second direction. The first pixel 422 of the first unit pixel 420 and the second pixel 432 of the second unit pixel may be arranged in the first direction. That is, the same colored sub pixels are arranged along the first direction. Therefore, the sub pixels of the first and second pixels 422 and 432 may be formed by a small mask scanning (SMS) process in which a pattern may be deposited on the substrate 410, while the substrate 110 is moved during pixel deposition while both the small mask scanning (SMS) and evaporation sources are kept stationary. Further, the small mask scanning process may use the mask which may be smaller than that of a fine metal mask deposition process, so that a damage of the mask (e.g., a bending of the mask) may be prevented or reduced.

The wiring groups 440 may include the plurality of wirings which may extend from the first region (VII) into the second region (VIII) of the substrate 410. The wirings may include a plurality of scan wirings (e.g., the first scan wiring 440*a* and the second scan wiring 440*b*). As illustrated in FIG. 6, the wiring groups 440 may be disposed between the second unit pixels 430 disposed adjacent to each other in the second direction. In this case, four first unit pixels 420 may be disposed between the adjacent wiring groups 440 in the first region (VII). The first scan wiring 440a may be disposed adjacent to a bottom portion of some unit pixel rows, and the second scan wiring 440b may be disposed adjacent to a top portion of other unit pixel rows. Further, a plurality of wiring (e.g., a first power supply wiring, a second power supply wiring, a control wiring, a data wiring, etc.) may extend in the second direction in the first region (VII) and the second region (VIII).

Figure 7:
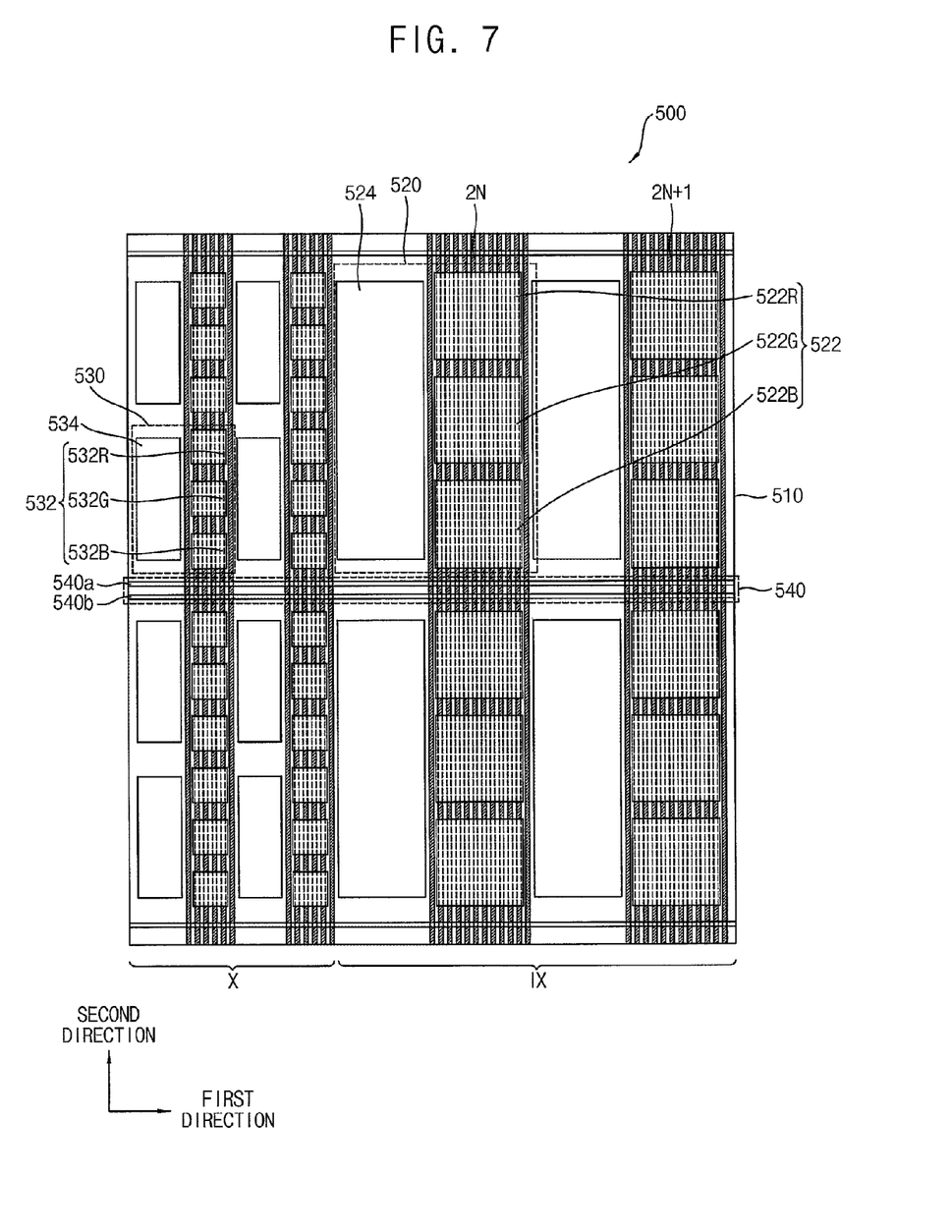
FIG. 7 is a plan view illustrating a display panel in accordance with other example embodiments.

FIG. 7 is a plan view illustrating a display panel in accordance with other example embodiments. The display panel may be substantially similar to those described with reference to FIG. 6 except for a first pixel 522.

Referring to FIG. 7, the display panel 500 may include a substrate 510, a plurality of first unit pixels 520, a plurality of second unit pixels 530, a plurality of wiring groups 540, etc.

An area of the first unit pixel 520 may be substantially 4n times greater than an area of the second unit pixel 530 (where n is an integer), and an area of the first transparent window 524 may be substantially 4n times greater than an area of the second transparent window 534. That is, sub pixels 522R, 522G and 522B of the first pixel 522 may not be aligned with sub pixels 532R, 532G and 532B of the second pixel 532, so that the first pixel 522 and the second pixel 532 may be formed by a fine metal mask (FMS) deposition process, instead of a SMS process.

In example embodiment, odd-numbered (2N+1) first unit pixels in the first unit pixel row may be connected to a first scan wiring 540a, and even-numbered (2N) first unit pixels in the first unit pixel row may be connected to a second scan wiring 540b. That is, first unit pixels disposed adjacent to each other in the first direction may receive scan signals from different scan wirings. Therefore, the first scan wiring 520a and the second scan wiring 540b may have an identical resistance-capacitance (RC) impedance. Therefore, an RC impedance difference between the first scan wiring 520a and the second scan wiring 540b may be reduced or prevented, and a stain like horizontal line defect may be prevented.

Figure 8:
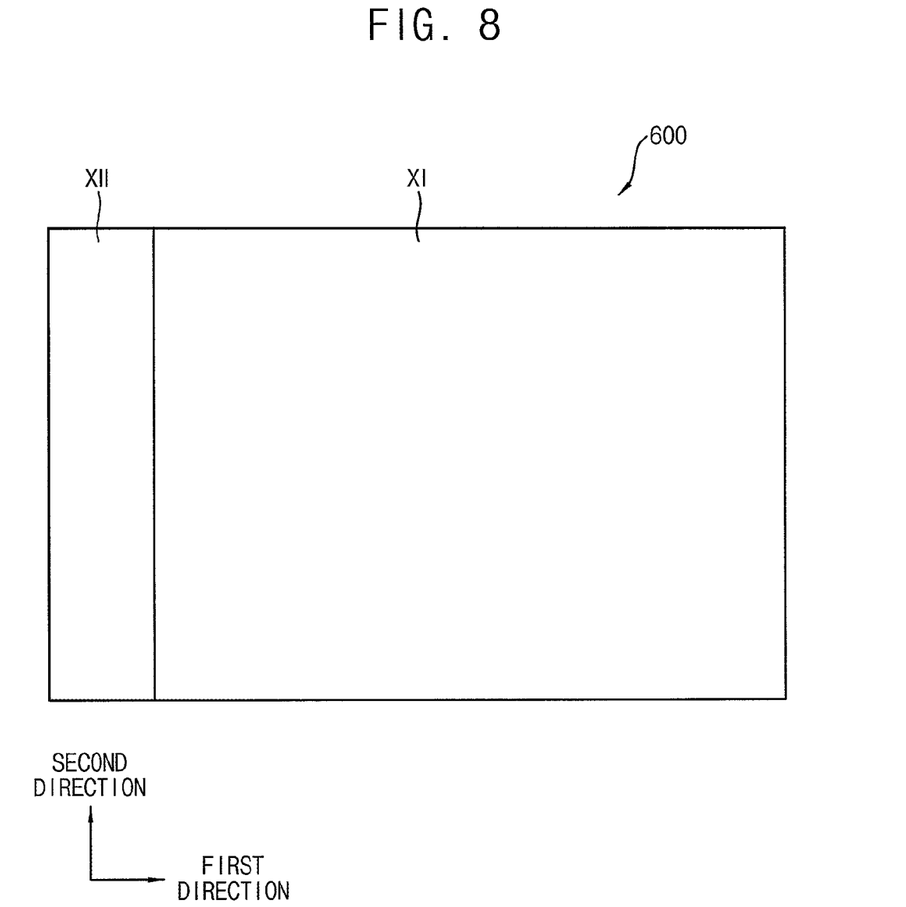
FIG. 8 is a plan view illustrating an arrangement of a second region and a first region of a display panel in accordance with other example embodiments.
Figure 9:
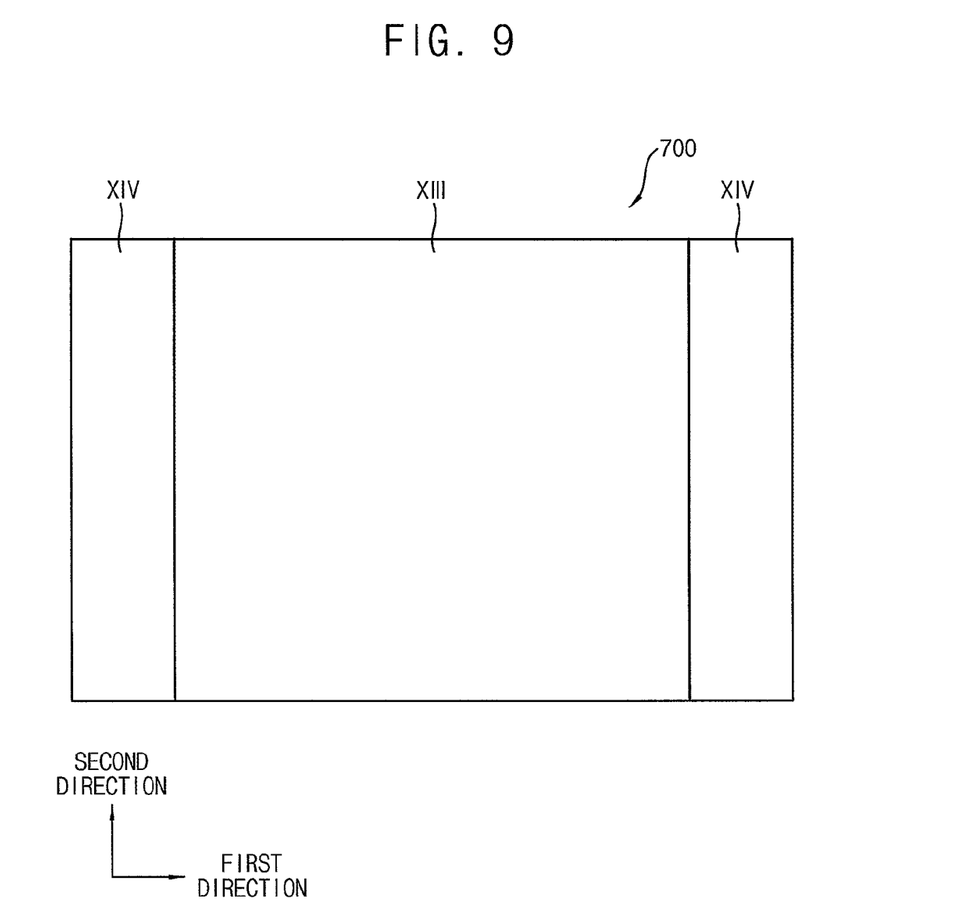
FIG. 9 is a plan view illustrating an arrangement of a second region and a first region of a display panel in accordance with other example embodiments.

FIG. 8 is a plan view illustrating an arrangement of a second region and a first region of a display panel in accordance with other example embodiments, and FIG. 9 is a plan view illustrating an arrangement of a second region and a first region of a display panel in accordance with other example embodiments.

Referring to FIG. 8, the display panel 600 may include a first region (XI) and a second region (XII). For example, the first region (XI) may be a high resolution region, and the second region (XII) may be a low resolution region. In this case, each of the first region (XI) and the second region (XII) may extend in a second direction. In this case, the first region (XI) may display a relatively small quantity of information, and may improve a transmittance of the display panel 600. Further, the second region (XII) may serve as a main display region for displaying a relatively large quantity of information. Therefore, the display panel 600 may have an improved efficiency.

As illustrated in FIG. 9, the display panel 700 may include a first region (XIII) and second regions (XIV). The first region (XIII) may be disposed at a center portion of the display panel 700, and the second regions (XIV) may be disposed at a left portion and a right portion of the display panel 700. For example, the first region (XIII) may be a low resolution region, and the second region (XIV) may be a high resolution region.

The present invention can be used for various applications in electronic apparatus having a display panel. For example, the present invention may be used in a computer, a laptop, a digital camera, a video camera, a cell phone, a smart phone, a smart pad, a personal digital assistant (PDA), an MP3 players, a vehicle navigation, a video phone, a surveillance system, a tracking system, a motion detection system, an image stabilization system, or the like.

The foregoing is illustrative of example embodiments, and is not to be construed as limiting the scope of the inventive concept. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed:

1. A display panel comprising:
   a substrate including a first region and a second region extending in a first direction;
   a plurality of first unit pixels disposed in the first region of the substrate, each first unit pixel having a first area and including a first pixel, the first pixel comprising at least three first sub-pixels; and
   a plurality of second unit pixels disposed in the second region of the substrate, each second unit pixel having a second area which is smaller than the first area and including a second pixel comprising at least three second sub-pixels
   a plurality of first wiring groups and a plurality of second wiring groups in the second region, each of the first and second wiring groups includes a plurality of wirings extending from the first region to the second region in a second direction that is substantially perpendicular to the first direction,
   the plurality of first wiring groups correspond to even-numbered (2N) pixel columns in the second region and the plurality of second wiring groups correspond to odd-numbered (2N+1) pixel columns, wherein N is an integer greater than 0, in the second region, a first wiring group and a second wiring group that extend from the same wiring group of the first region are adjacent to each other and have a bilateral symmetry with a center line between the first wiring group and the second wiring group as the line of symmetry.

2. The display panel of claim 1, wherein each of the first and the second wiring groups includes a first power supply wiring, a second power supply wiring, a control wiring and a data wiring.

3. The display panel of claim 1, further comprising:
   a plurality of first scan wirings disposed in the first region; and
   a plurality of second scan wirings disposed in the second region,
   wherein the plurality of first scan wirings and the plurality of second scan wirings extend in the first direction.

4. The display panel of claim 1, wherein each of the first unit pixels further includes:
a first transparent window disposed in the first region, the first transparent window located adjacent to the first pixel.

5. The display panel of claim 4, wherein each of the second unit pixels further includes:
a second transparent window disposed in the second region, the second transparent window located adjacent to the second pixel.

6. The display panel of claim 5, wherein an area of the first pixel is 4n times (where n is an integer) greater than an area of the second pixel.

7. The display panel of claim 5, wherein an area of the first transparent window is 4n times (where n is an integer) greater than an area of the second transparent window.

8. The display panel of claim 5, wherein the first wiring group corresponding to even-numbered (2N) pixel column in the second region and the second wiring group corresponding to odd-numbered (2N+1) pixel column in the second region have a fan-out portion at an interface between the first region and the second region.

9. A display panel comprising:
a substrate including a first region and a second region extending in a first direction;
a plurality of first unit pixels disposed in the first region of the substrate, each first unit pixel has a first area and includes a first pixel and an adjacent first transparent window;
a plurality of second unit pixels disposed in the second region of the substrate, wherein each second unit pixel has a second area which is smaller than the first area of the first unit pixel and includes a second pixel and an adjacent second transparent window; and
plurality of wiring groups, each including a plurality of wirings, the plurality of wirings extending from the first region of the substrate to the second region of the substrate in a second direction that is substantially perpendicular to the first direction,
wherein the plurality of wiring groups in the second region includes a plurality of first wiring groups and a plurality of second wiring groups, the plurality of first wiring groups correspond to even-numbered (2N) pixel columns in the second region, the plurality of second wiring groups correspond to odd-numbered (2N+1) pixel columns in the second region (where N is an integer greater than 0), and
wherein a first wiring group and a second wiring group extending from the same wiring group of the first region have a bilateral symmetry in the second region, with an extension line of the center of the second transparent window as the line of symmetry.

10. The display panel of claim 9, wherein the first wiring group corresponding to even-numbered (2N) pixel column in the second region and the second wiring group corresponding to odd-numbered (2N+1) pixel column in the second region have a fan out portion at an interface between the first region and the second region.

11. The display panel of claim 10, wherein the first wiring group corresponding to even-numbered (2N) pixel column in the second region and the second wiring group corresponding to odd-numbered (2N+1) pixel column in the second region have a substantially identical length in the second direction.

* * * * *